US012332322B2

(12) United States Patent
Howard

(10) Patent No.: US 12,332,322 B2
(45) Date of Patent: Jun. 17, 2025

(54) APPLIANCE WITH INTEGRATED GROUND FAULT DETECTION

(71) Applicant: SHARKNINJA OPERATING LLC, Needham, MA (US)

(72) Inventor: Damian Howard, Winchester, MA (US)

(73) Assignee: SharkNinja Operating LLC, Needham, MA (US)

( * ) Notice: Subject to any disclaimer, the term of this patent is extended or adjusted under 35 U.S.C. 154(b) by 291 days.

(21) Appl. No.: 16/929,594

(22) Filed: Jul. 15, 2020

(65) Prior Publication Data

US 2021/0018572 A1 Jan. 21, 2021

Related U.S. Application Data

(60) Provisional application No. 62/874,354, filed on Jul. 15, 2019.

(51) Int. Cl.
*G01R 31/52* (2020.01)
*A47J 43/046* (2006.01)
*H02H 3/16* (2006.01)

(52) U.S. Cl.
CPC ............. *G01R 31/52* (2020.01); *H02H 3/167* (2013.01); *A47J 43/046* (2013.01)

(58) Field of Classification Search
CPC ........ G01R 31/52; H02H 3/167; A47J 43/046
See application file for complete search history.

(56) References Cited

U.S. PATENT DOCUMENTS

| 3,064,949 | A | * | 11/1962 | Dewenter | A47J 43/046 366/144 |
| 3,213,321 | A | | 10/1965 | Dalziel | |
| 4,174,073 | A | * | 11/1979 | Maher | A47J 43/06 241/37.5 |
| 4,951,169 | A | | 8/1990 | Morse | |
| 4,967,308 | A | * | 10/1990 | Morse | H02H 5/083 307/118 |
| 5,109,315 | A | | 4/1992 | Morse | |
| 5,757,598 | A | | 5/1998 | Aromin | |
| 5,847,913 | A | * | 12/1998 | Turner | G01R 31/52 361/115 |

(Continued)

FOREIGN PATENT DOCUMENTS

CN 102647931 1/2015

OTHER PUBLICATIONS

Osha, Wiring design and protection, Apr. 27, 2019 (Year: 2019).*

(Continued)

*Primary Examiner* — Alexander Satanovsky
*Assistant Examiner* — Sharah Zaab
(74) *Attorney, Agent, or Firm* — The Webb Law Firm

(57) ABSTRACT

The present disclosure is generally directed to a GF detection circuit for use in blenders and other appliances that can detect current leak/GF events and selectively decouple/de-energize components of the blender that could bring a user in contact with dangerous electrical currents. Preferably, a blender consistent with the present disclosure includes at least one ground plane, e.g., in the form of conductive material/sections, disposed on the blender and/or blender jar that act as an input to a GF detection circuit that is at least partially implemented within the base of the blender.

16 Claims, 11 Drawing Sheets

(56) References Cited

U.S. PATENT DOCUMENTS

| | | | | |
|---|---|---|---|---|
| 5,879,173 | A * | 3/1999 | Poplawski | H01R 13/6582 |
| | | | | 439/138 |
| 6,528,913 | B1 * | 3/2003 | Michaels | H02K 3/50 |
| | | | | 336/107 |
| 8,064,174 | B2 | 11/2011 | Williams et al. | |
| 2002/0176320 | A1 * | 11/2002 | Wulf | A47J 43/0727 |
| | | | | 366/205 |
| 2007/0081281 | A1 | 4/2007 | Hamer | |
| 2008/0007878 | A1 | 1/2008 | Gandolfi et al. | |
| 2008/0094764 | A1 | 4/2008 | Zhang et al. | |
| 2009/0212967 | A1 * | 8/2009 | Bonasia | H02H 3/335 |
| | | | | 340/4.32 |
| 2010/0046128 | A1 | 2/2010 | Wang et al. | |
| 2015/0101491 | A1 * | 4/2015 | Lin | A47J 27/004 |
| | | | | 99/348 |
| 2016/0225562 | A1 * | 8/2016 | Franks | H02H 3/08 |
| 2017/0006411 | A1 * | 1/2017 | Zakaria | H04W 76/14 |

OTHER PUBLICATIONS

PCT Search Report and Written Opinion, mailed Oct. 9, 2020, received in corresponding PCT Application No. PCT/US2020/042070, 11 pages.
Chinese Office Action with English translation report issued Apr. 28, 2023, received in Chinese Patent Application No. 202080061678.4, 10 pages.
Chinese Office Action with machine generated English translation issued Nov. 28, 2023, received in Chinese Patent Application No. 202080061678.4, 16 pages.
Extended European Search Report issued Jul. 18, 2023, received in European Patent Application No. 20840080.4, 7 pages.

* cited by examiner

APPLIANCE WITH INTEGRATED GROUND FAULT DETECTION

CROSS-REFERENCE TO RELATED APPLICATIONS

This application claims the benefit of U.S. Provisional Application No. 62/874,354 filed on Jul. 15, 2019, which is incorporated herein by reference in its entirety.

TECHNICAL FIELD

This specification relates generally to appliances, and more particularly, to an appliance with integrated ground fault/current leak detection to at least partially disable the appliance in response to detection of food/liquids making contact with energized pins/terminals of the appliance.

BACKGROUND INFORMATION

According to the National Electrical Code, a "ground fault" is a conducting connection (whether intentional or accidental) between any electric conductor and any conducting material that is grounded or that may become grounded. Electricity always seeks out the easiest path to the ground, and in a ground fault, this can include electricity conducting through a person's body.

Research has shown that as little as 5 milliamps (mA) or 0.005 A applied for 5 milliseconds (ms) can potentially be fatal. Since the late 1960s, ground-fault circuit interrupters (GFCI) have become wide-spread and required in new construction and remodeling around the United States and abroad. GFCIs are generally required to be fast-acting, e.g., within 5 milliseconds, and capable of detecting 5 mA or less of leakage current.

Many homes within the United States have not been updated to include protective devices such as GFCI outlets. In addition, some building codes were slow to mandate GFCI outlets in both bathrooms and kitchens, with the result being many homes/dwellings having GFCI outlets only within bathrooms.

Some appliances require electrical interconnection that can become dangerous under certain conditions. A heated blender is one such example where there is need for an electrical connection from the base of the blender to the jar of the blender so that a heating element within the jar can be powered. To provide sufficient power to the heating element and to allow for the heating of food/liquids within the jar, the heating element can require a line voltage to be connected through the pins/terminals of the blender base and blender jar. GFCI can significantly decrease the chance of those line voltages from making contact with a user, but the availability of GFCI and associated costs raise non-trivial challenges.

BRIEF DESCRIPTION OF THE DRAWINGS

The drawings included herewith are for illustrating various examples of articles, methods, and apparatuses of the teaching of the present specification and are not intended to limit the scope of what is taught in any way.

DETAILED DESCRIPTION

Figure 1:
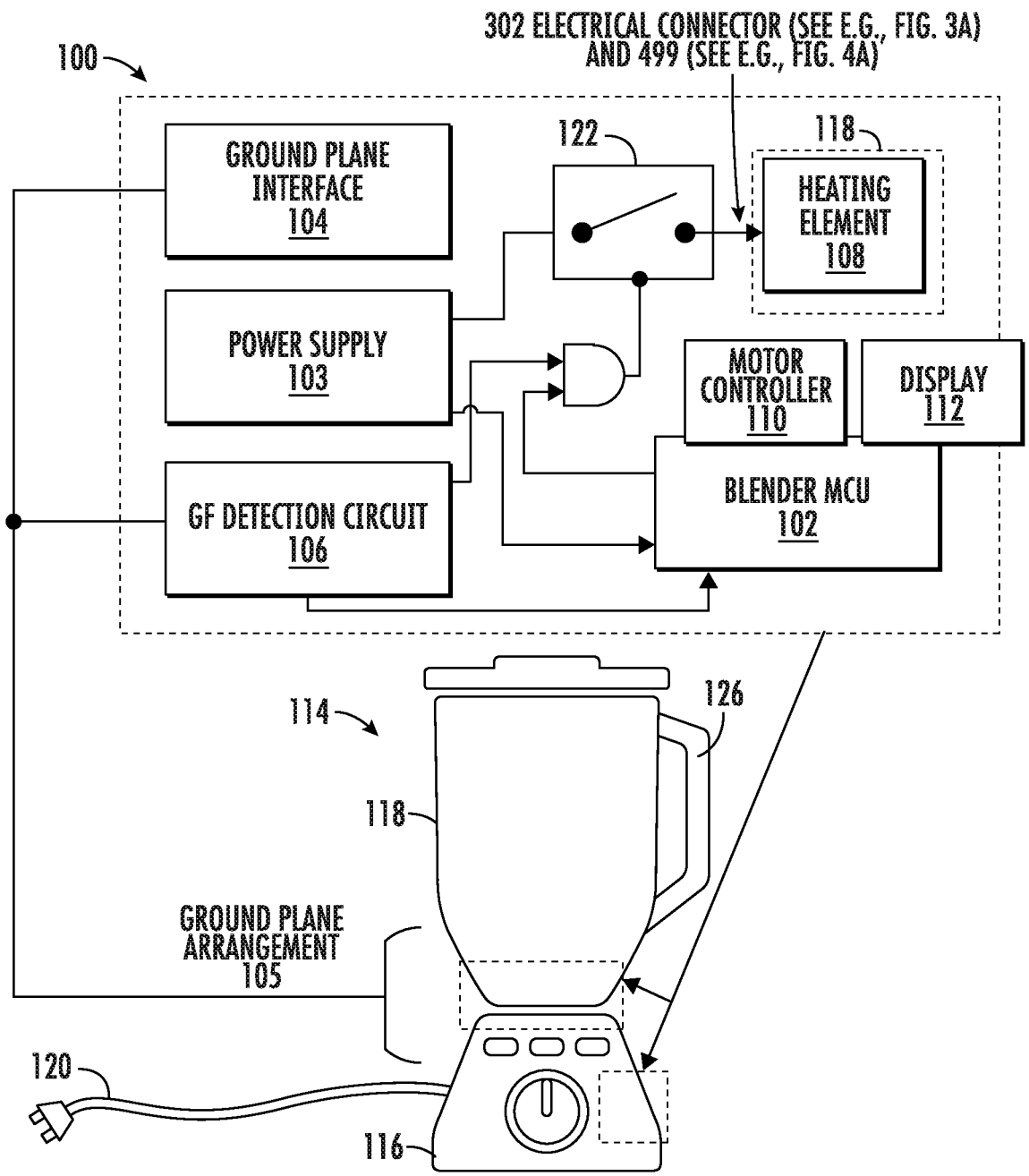
FIG. 1 shows an example ground fault monitoring system for use in a blender, in accordance with embodiments of the present disclosure.

As discussed above, a ground fault circuit interrupter disconnects a power source upon the detection of an undesired grounding (referred to herein as a GF event) of a power rail. Such devices are effective at reducing electric socks, but unfortunately are often unavailable and can provide a false sense of security. GFCIs require periodic testing and replacement, and can be rendered ineffective over time without warning if not tested regularly. Many GFCIs go untested for years on end.

Some appliances feature power-cord based GF/leak detectors such as equipment leakage current interrupters (ELCIs). However, ELCIs and the like add considerable bulk and often require expensive components to implement. In addition, when a GF event gets detected by a GFCI, or other similar device, the result can be an abrupt shutting "OFF" of the device until the user initiate a reset or otherwise remedies the cause of the GF.

Thus, the present disclosure is generally directed to a GF detection circuit for use in blenders that can detect current leak/GF events and selectively decouple/de-energize components of the blender that could bring a user in contact with dangerous electrical currents. Note, aspects and features disclosed herein are equally applicable to other types of appliances including pressure cookers, mixers, and air fryers, just to name a few. Preferably, a blender consistent with the present disclosure includes at least one ground plane, e.g., in the form of conductive material/sections, disposed on the blender and/or blender jar that act as an input to a GF detection circuit that is at least partially implemented within the base of the blender. The base of the blender further preferably includes a receptacle (or socket) to receive a blender jar and an electrical interconnect/connector within the receptacle to mate with a corresponding connector of the blender jar. The electrical interconnect provides power from the base to the jar for purposes of, for instance, energizing a heating element within the base. In an embodiment, up to 110v (or more depending on the location) may then be provided from the blender base to the blender jar.

The present disclosure has identified circumstances where conductive blender material, such as a banana smoothie recipe, unintentionally spills over the blender jar and pools into the receptacle of the blender base. This blender material may also be referred to herein as spillover conductive blender material. The pooling of conductive blender material can result in contact between "live" power pin(s) of the connector and the conductive blender material. The GF detection circuit utilizes the one or more ground planes to detect this condition, e.g., based on a measured current leak, and disable/de-energize the power pins to avoid potential electrical shocks. The GF detection circuit thus can transition the blender into a fault mode/operating state wherein the heating element and associated features/functions get disabled. Power to other components, such as an associated microcontroller, blade motor controller, blade motor, can preferably remain uninterrupted during the fault mode, e.g., remains capable of being energized by a power supply.

According, a blender consistent with the present disclosure provides numerous advantageous over other approaches, and particularly those approaches that require a GFCI receptacle to operate safely. For example, faults get visually displayed, e.g., via a user interface of the blender, and can optionally present a mitigating action such as a prompt that states "FAULT DETECTED, HEAT FUNCTIONS DISABLED, CLEAN UNIT OR CONSULT MANUAL." Alternatively, or in addition, the fault may be visually displayed via one or more LEDs and/or audibly provided via an implemented speaker. Preferably, the fault may also cause the blender to send a message, preferably via a wireless network connection, to a user's smart phone or other computing device. An "app" on the smart phone or computer device may then display the error condition and preferably suggest a mitigating action to clear the error condition. This advantageously allows a user to identify the fault has occurred and steps that can remedy the fault. Also, the blender can optionally remain functional/energized for other tasks such as blending/chopping that do not require the heating element.

In addition, the GF detection circuits of the present disclosure can conform to various standards, e.g., UL-standards, that require fast response times, e.g., 5 ms or less, and that require maximum current thresholds, e.g., 5 mA. A blender consistent with the present disclosure can therefore provide GF detection without requiring a GFCI-enabled outlet or a bulky/cumbersome power cord-based ELCI device. Moreover, GF detection circuits of the present disclosure can include response times under 5 ms, and preferably between 2-5 ms, although other predetermined amount of times may be achieved with minor modification. Thus, the blender remains compatible with modern GFCI outlets and can independently detect and react to GF faults without triggering the GFCI outlet (e.g., to avoid abruptly de-energizing the blender).

As generally referred to herein, conductive blender material (also referred to herein as conductive material) refers to any material commonly placed into blenders and other appliances, e.g., food/beverages, capable of electrically conducting. For example, electrically conducting can refer to a material that has an associated electrical resistance value of less than 10,000 ohm per 10 mm. For example, the present disclosure has identified that a banana smoothie consisting of a frozen 14 oz banana cut into one inch pieces, six ice cubes and twelve ounces of orange juice measures between 200 to 2,000 ohm per 10 mm and a salt water mix of forty grams of water and one tablespoon of salt measures between 400 and 500 ohms per 10 mm. Both of these conductive blender materials could therefore trigger an unsafe GF condition should the same come in contact with energized conductors of a blender.

Embodiments illustrated and discussed herein generally illustrate and discuss blenders with removable blender jars. In particular, the present disclosure specifically illustrates and describes a blender configuration that includes a heating element disposed within the removable blender jar. However, aspects and embodiments disclosed herein are equally applicable to other blender configurations and appliances. For example, aspects and features described herein can be implemented in mixers, food processors, immersion blenders, or any other device in which ground faults could occur, with minor modifications.

In addition, while the example GF detection circuits herein include using a sensing resistor-based voltage measurement scheme, other detection approaches are within the scope of this disclosure. For instance, current sensing coils/transformers and supporting circuitry can be utilized to measure a current differences between the Live and Neutral (return) lines for GF detection purposes.

Turning to the Figures, FIG. 1 illustrates an example ground fault monitoring system 100 (also referred to herein as system 100) for use in blender devices. As shown, the system 100 includes a blender microcontroller (MCU) 102, power supply 103, ground fault (GF) detection circuit 106, and heating element 108. The system 100 further includes a motor controller 110 and an optional display 112 (which may also be referred to herein as a user interface). Note, the system 100 is shown in a highly simplified manner for ease of description and simplicity, and not for purposes of limitation.

The embodiment of FIG. 1 further shows a blender 114 (also referred to herein as an appliance) with a base 116 (also referred to herein as a first portion), and blender jar 118 (also referred to herein as a second portion). The base 116 electrically couples to AC main via power cord 120. As discussed in greater detail, the blender 114 operates on 110v AC, although other voltages are within the scope of this disclosure depending on the AC service.

The base 116 further defines a cavity (not shown), in which at least a portion of the system 100 gets disposed. The base 116 further includes one or more buttons/controls to receive user input to initiate blender operation, cease blender operations, and to adjust blender settings to a desired mode. The base 116 utilizes optional display 112 to indicate the operational status of the blender 114 (e.g., OFF/ON), blender settings, and fault conditions, e.g., electrical fault conditions detected by the GF detection circuit 106 as discussed in further detail below.

The blender MCU 102 comprises at least one processing device/circuit such as, for example, a digital signal processor (DSP), a field-programmable gate array (FPGA), Reduced Instruction Set Computer (RISC) processor, x86 instruction set processor, microcontroller, an application-specific integrated circuit (ASIC). The blender MCU 102 may comprise a single chip, or multiple separate chips/circuitry. The blender MCU 102 may implement various methods and techniques disclosed herein using software (e.g., C or C++ executing on the blender MCU 102), hardware (e.g., circuitry including the GF detection circuit 106, hardcoded gate level logic or purpose-built silicon) or firmware (e.g., embedded routines executed by the blender MCU 102), or any combination thereof.

The blender MCU 102 can receive input signals from the GF detection circuit 106 and use the same to conditionally activate/energize the heating element 108, and more specifically, switchably electrically couple or decouple the heating element 108 from the power supply 103, e.g., by electrically disconnecting the heating element 108 from one or more conductors, and preferably by mechanically decoupling the heating element from one or more conductors. The blender MCU 102 can implement a logical AND with output of the GF detection circuit 106 to ensure that heating element 108 cannot be electrically coupled to the power supply 103 when a GF event gets detected without the necessity of the MCU monitoring the GF detection circuit first. Rather, the GF detection circuit can be monitored by the MCU so that, for example, error messages can be displayed to the user by display 112 when the GF detection circuit has detected a fault condition. The blender MCU 102 can also execute various blender routines based on user-selection via the buttons/interface of the base 116 to provide a signal to the motor controller 110 to cause the same to activate blades (not shown) within the blender jar 118, adjust blade speed, pulse blades, and so on.

The power supply 103 comprises circuitry capable of receiving power, e.g., via power cord 120, and providing the same for consumption by components/loads of the blender 114. Some components of the blender 114 can utilize AC mains voltages, e.g., the blade motor and the heating element 108, while other components such as the optional display 112 utilize stepped-down DC voltages, e.g., 5V DC. Thus, the power supply 103 can include power converters (e.g., DC-DC converters), rectifiers, regulators and other circuitry capable of converting power, e.g., from AC mains, into stepped-down DC signal for use by the components/loads of the blender 114.

The heating element 108 is preferably placed within the blender jar 118 so as to heat/warm food/liquids that are placed in the jar. The heater element relay 122 is preferably placed within the blender base 116. The heater element relay 122 is electrically coupled to power supply 103 via one or more conductors. In an embodiment, the blender jar is removable from the blender base 116 and therefore the heater element electrical connection can be formed by a mating connector pair arrangement, shown as electrical interconnects 302 and 499 (See FIG. 3C and FIG. 4A).

The GF detection circuit 106 comprises circuitry in the form of discrete components, chips, or any combination thereof to monitor for GF events. One example of the GF detection circuit 106 is shown and described in greater detail below with reference to the GF detection circuit 500 shown in FIG. 5. GF detection circuit 106 electrically couples to a ground plane interface 104 (also referred to herein as a ground plane interconnect), which will be discussed in greater detail below. The GF detection circuit 106 therefore couples to the blender 114 in a high-side sensing configuration.

Continuing on, the GF detection circuit 106 outputs an electrical signal that indicates the presence of a GF event, or the lack thereof, as the case may be. In an embodiment, the GF detection circuit 106 outputs a normal LOW. The blender MCU 102 can utilize the output of the GF detection circuit 106 to detect the presence of GF events, and in response to the same, cause relay 122 to OPEN to electrically disconnect/decouple the heating element 108 from the power supply 103 (and more specifically, one or more conductors electrically coupled to the power supply 103). Preferably, the GF detection circuit 106 directly causes the relay 122 to OPEN (e.g., mechanically), thereby not necessarily requiring intermediate components and/or software control by the blender MCU 102. Note, the switch (also referred to herein as a relay) 122 and/or associated logic may be implemented within the blender MCU 102 and the embodiment shown in FIG. 1 is not intended to be limiting. The GF detection circuit 106 can also be connected to the blender MCU 102 in addition to direct control of the relay 122 for the purpose of allowing the blender MCU 102 to also detect the ground fault condition (also referred to herein as a ground fault event or simply a ground fault) so that the user can be notified by means of an error message on the display 112, for example.

The motor controller 110 includes circuitry and components capable of receiving a driving signal from the blender MCU 102 causing an associated motor (not shown) to rotate blades within the blender jar 118.

The display 112 can include one or more LEDs, liquid crystal displays (LCDs), or any other component capable of visually indicating operational status of the blender 114. In some cases, the blender 114 can include an antenna and wireless interface circuit (not shown) to communicate with remote computing devices, e.g., using Low-power Bluetooth (BLE) or other suitable communication standard. Remote computing devices, such as smart phones and tablets, can therefore include 'Apps' configured with user interface elements that display operational status of the blender 114. Thus, the blender 114 can also send status messages and/or error messages (also referred to herein as fault messages) to remote computing devices for display via an "App." Alternatively, or in addition, a buzzer or other such audible device can be used together or in place of the display 112 to provide an auditory tone to signify an error message.

The ground plane arrangement 105 comprises a plurality of conductive plates/surfaces disposed at predetermined positions of the blender 114, with the predetermined positions being areas likely to come into contact with a user during operation, e.g., the user interface/display 112, the handle 126 of the blender jar 118, and/or the bottom/base of the blender jar 118. The ground plane arrangement 105 electrically couples to the ground plane interface 104. As discussed in greater detail below, the ground plane interface 104 interconnects each of the ground planes to provide, in a general sense, a single pseudo ground that gets used by the GF detection circuit 106 to detect GF events/current leaks. This pseudo ground may or may not be directly connected to the ground pin of power cord 120 but instead be connected through a sensing resistor as described below depending on the GF detection circuit used. For purposes of this description, the term pseudo ground is used to differentiate from the "ground connection" commonly referred to as earth ground which is the long round middle pin found on a typical 3-pin AC household plug.

In operation, the blender 114 energizes the blender MCU 102 via the power supply 103. In response to the GF detection circuit 106 outputting an electrical signal indicating a GF event (e.g., a logic HIGH), the MCU 102 can receive the electrical signal and transition to a GF fault mode. Transitioning to the GF fault mode can include, for example, displaying an error message via the display 112 and/or a mitigating action (e.g., "ELECTRICAL FAULT-CLEANING REQUIRED"), an audible tone/indicator, and/or energizing one or more LEDs. As discussed above, remote computing devices may also visualize one or more mitigating actions via an "App" that can remedy fault conditions such as a GF fault. This can include an App that provides text descriptions, illustrations, and/or videos (or links to videos) that detail how to clean the blender 114.

Figure 2A:
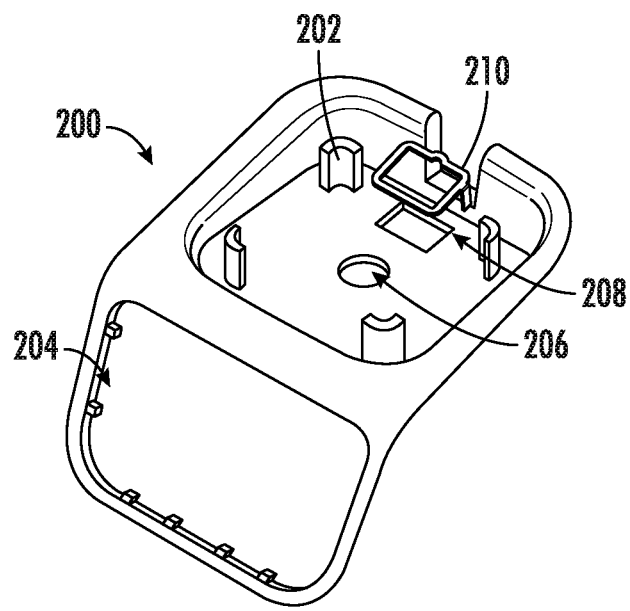
FIG. 2A shows a frame element for use with a blender base in accordance with an embodiment.

FIG. 2A shows an example embodiment of a frame element 200 that couples to the base of a blender, e.g., base 116 (FIG. 1), to provide a receptacle/socket to (removably) couple to and securely hold a blender jar, e.g., blender jar 118. The frame element 200 can be formed of a conductive material, e.g., a metal or metal alloy, and provide a first ground plane. Preferably, the first ground plane is disposed on an external surface of the blender 114, and more preferably, the first ground plane is disposed on an external surface that defines the base 116. Note, the use of the terms "first," "second," and "third" when referring to elements herein are for purposes of clarity and distinguishing between elements, and not for purposes of limitation.

As previously discussed, a blender consistent with the present disclosure preferably includes multiple ground planes which are electrically interconnected with each other to collectively form a single pseudo ground plane. This interconnection between ground planes, referred to herein as the ground plane interface 104, is formed from at least first and second conductive plates (e.g., conductive plates 210, 410 discussed below) which are disposed on a base of the blender jar and the base of the blender, respectively. Thus, coupling the blender jar 118 into the base 116 of the blender causes the plates to come into contact (direct) with each other and electrically couple. In addition, each ground plane can be connected to the ground plane interface 104 via wired connections based on electrical interconnects 302 and 499. Note, the GF detection circuit 106 can operate without the blender jar 118 coupled to the base 116.

As shown, the frame element 200 includes a receptacle 202 (or socket) defined by a plurality of sidewalls and a displayer/user interface cutout 204. The receptacle 202 is configured to receive at least a portion of a blender jar and securely hold the same during blender operations. The receptacle 202 includes a first through hole (or opening) 206 having a generally round shape to allow a shaft driven by a blade motor to extend through and drive blades within the blender jar. The receptacle 202 includes a second through hole (or opening) 208 having a rectangular shape. The second through hole 208 allows for electrical communication between circuitry in the blender base and the blender jar.

Figure 2B:
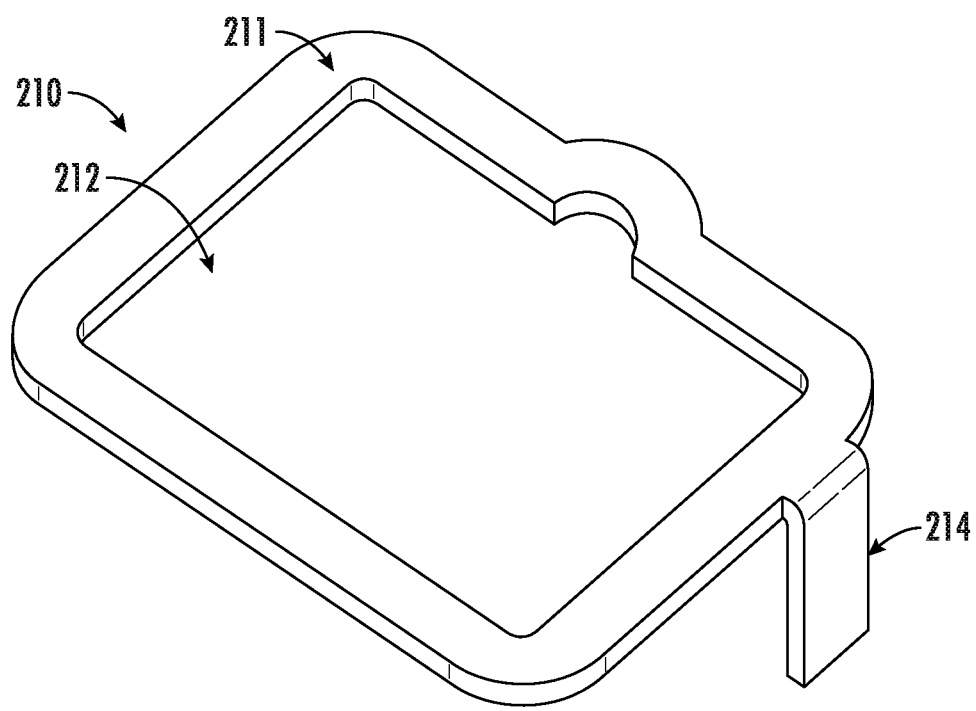
FIG. 2B shows a conductive plate for use with the frame element of FIG. 2A, in accordance with an embodiment.

Continuing on, a conductive plate 210 (shown more clearly in FIG. 2B) includes a body portion 211 that defines an opening 212 with a shape that generally corresponds with the second through hole 208 of the receptacle 202. The body portion 211 further includes a projection 214 (or arm) that extends substantially transverse from the body portion 211. The body portion 211 comprises a substantially electrically conductive material such as aluminum, steel, or any other suitable metal/metal alloy. The conductive plate 210 couples within the receptacle 202 and aligns with the second through hole 208 such that the second through hole 208 of the receptacle 202 and opening 212 collectively provide a slot extending therethrough. When the conductive plate 210 gets coupled into the receptacle 202, the projection 214 extends at least partially within the body of the blender to electrically couple with the ground plane interface 104 and GF detection circuit 106, e.g., via a spade terminal or other suitable connector.

Figure 3A:
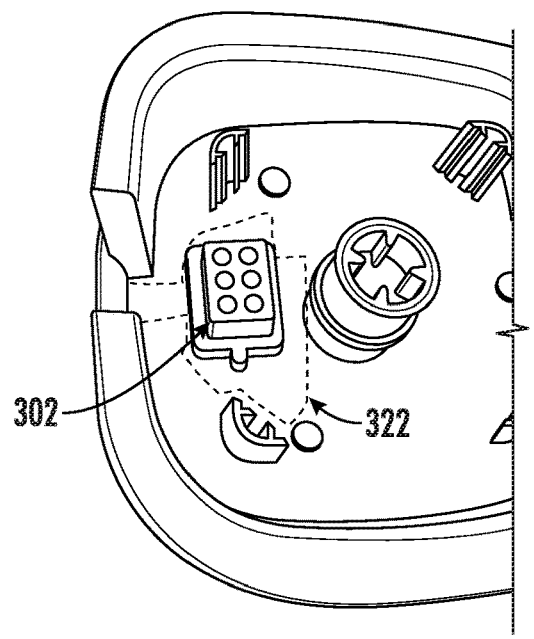
FIG. 3A shows a blender base having a receptacle with an electrically conductive region/layer surrounding an electrical interconnect, in accordance with an embodiment of the present disclosure.

FIG. 3A shows an example blender base that includes an electrical interconnect 302 within an associated socket. As shown, a layer of electrically conductive material 322 can at least partially, and preferably fully, surround the electrical interconnect 302.

Figure 3B:
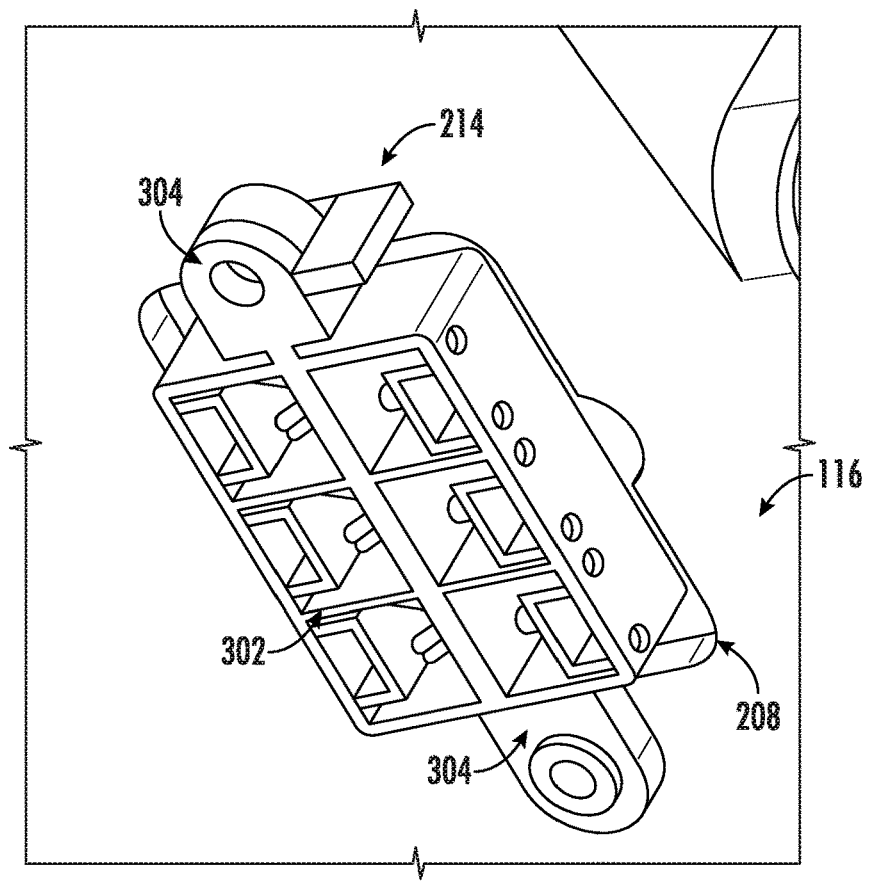
FIG. 3B shows a perspective view of an electrical interconnect in the form of a 6-pin connector, in accordance with an embodiment of the present disclosure.

FIG. 3B shows an example view of the second through hole 208 of the base 116 from inside the cavity of the same. As shown, the electrical interconnect 302 is implemented as a 6-pin connector that extends through the second through hole 208 and attaches to the base 116 via tabs 304. The electrical interconnect 302 includes a plurality of passageways with conductive elements that extend therein to electrically couple with a mating connector (e.g., of the blender jar). Note, the electrical interconnect 302 can be any suitable electrical interconnect/connector and the embodiment of FIG. 3B-3D is not intended to be limiting.

Figure 3C:
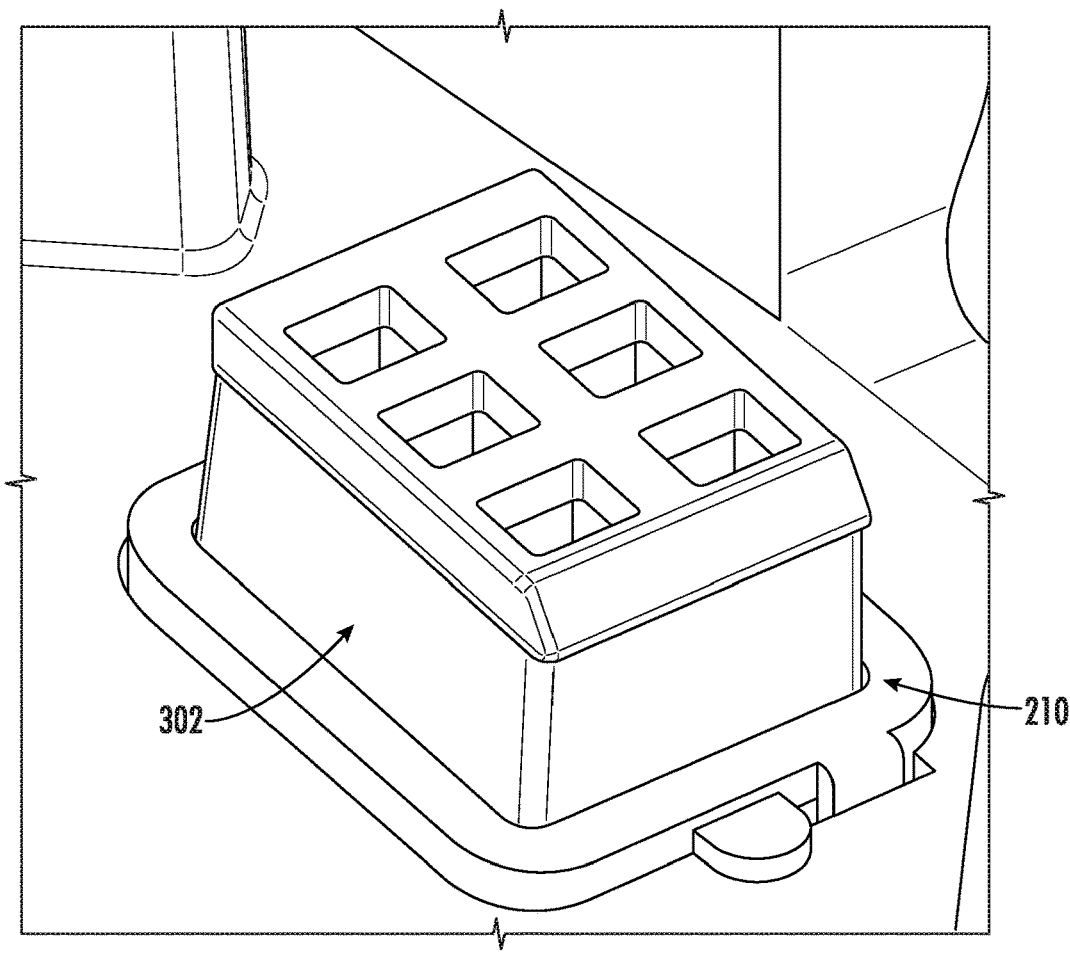
FIG. 3C shows another perspective view of the electrical interconnect, in accordance with an embodiment of the present disclosure.

FIG. 3C shows the opposite side of the electrical interconnect 302 which extends into the receptacle 202 (e.g., the connector is being viewed from the top in FIG. 3C). As shown, the electrical interconnect 302 includes a body configured to releasably couple from a corresponding mating connector 499 (See FIG. 4A) of the blender jar 118. Surrounding the base of the electrical interconnect 302 is the conductive plate 210 which preferably forms a continuous ring around the base of the electrical interconnect 302. The electrical interconnect 302 can comprise a so-called "waterproof connector" which resists the ingress of water/food particles into the associated passageways when uncoupled from the mating connector of the blender jar 118. However, the electrical interconnect 302 may not completely resist ingress of material when coupled to the mating connector of the blender jar 118.

In an embodiment, the electrical interconnect 302 extends to a height of about 12 millimeters (mm). Each of the passageways of the electrical interconnect 302 are disposed at about 4 mm from an adjacent sidewall. Thus, a relatively small amount of pooling within the receptacle 202 (see FIG. 2A) can potentially result in the ingress of food/liquid into the passageways, and importantly, contact with live pin(s)/conductor(s) carrying 120V, for instance. Water-proof connectors reduce such risks, but the protection can become compromised/negated when pins from the mating connector penetrate the passageways of the electrical interconnect 302. Pooling consistent with highly viscous liquids such as a smoothie or soup mix can cause a conductive path to extend from the user interface cutout 204 (and/or surrounding surfaces of the blender) to the electrical interconnect 302.

Figure 3D:
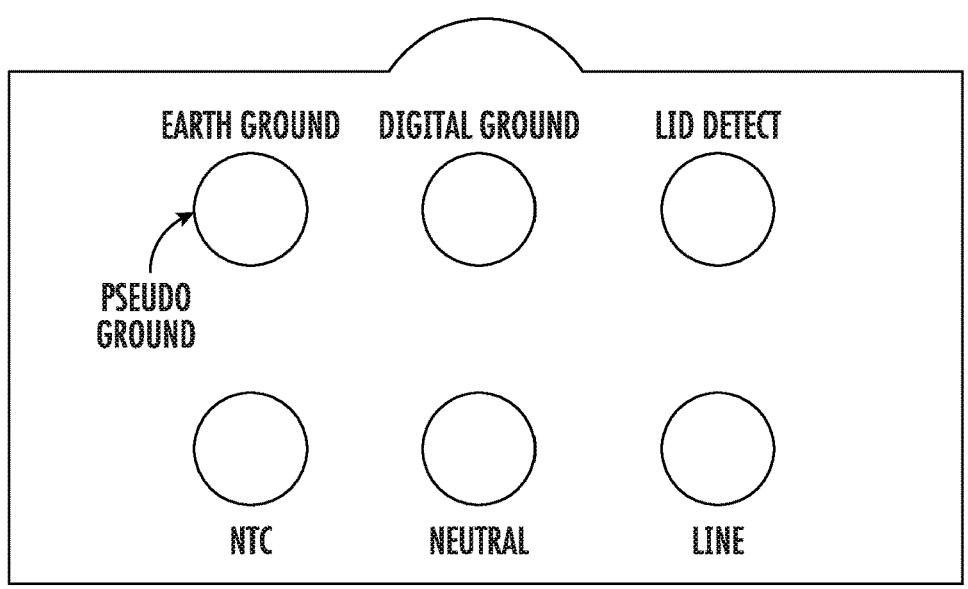
FIG. 3D shows an example pin-out for the electrical interconnect shown in FIGS. 3B and 3C, in accordance with an embodiment of the present disclosure.

FIG. 3D shows an example pin-out for the electrical interconnect 302. Note, other pin-outs and connector types are within the scope of this disclosure and the embodiment of FIGS. 3A-3D are not intended to be limiting.

Figure 4A:
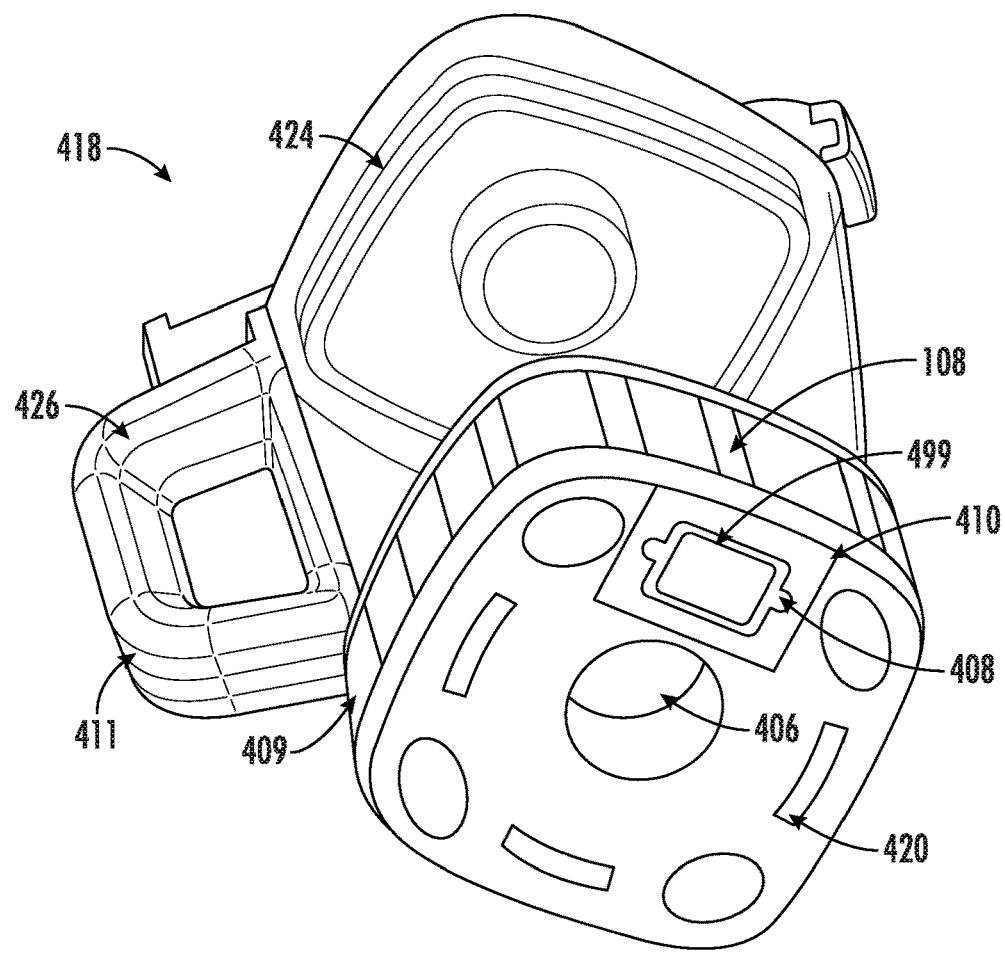
FIG. 4A shows an example of a removable blender jar consistent with embodiments of the present disclosure.

FIG. 4A shows an example blender jar 418 suitable for use with a blender that implements the receptacle 202 of FIG. 2A, e.g., the blender 114 of FIG. 1. The blender jar 418 includes a body 424 (preferably formed from transparent material) that forms a cavity to receive blender material (e.g., food and beverages) and a base 420 for coupling into the receptacle 202 of the blender base. A removable cover encloses the cavity during blending operations. A handle 426 includes a shape/contour that allows for one-handed removal of the blender jar 418 from the receptacle 202 of the blender base. The base 420 further includes a first opening 406 to receive a shaft/clutch to drive the blades and a second opening 408 to couple to the conductive plate 410. The base 420 further includes the heating element 108 that thermomechanically couples into the body 424 thereby allowing the heating and warming of foods/liquids placed in the body 424.

Figure 4B:
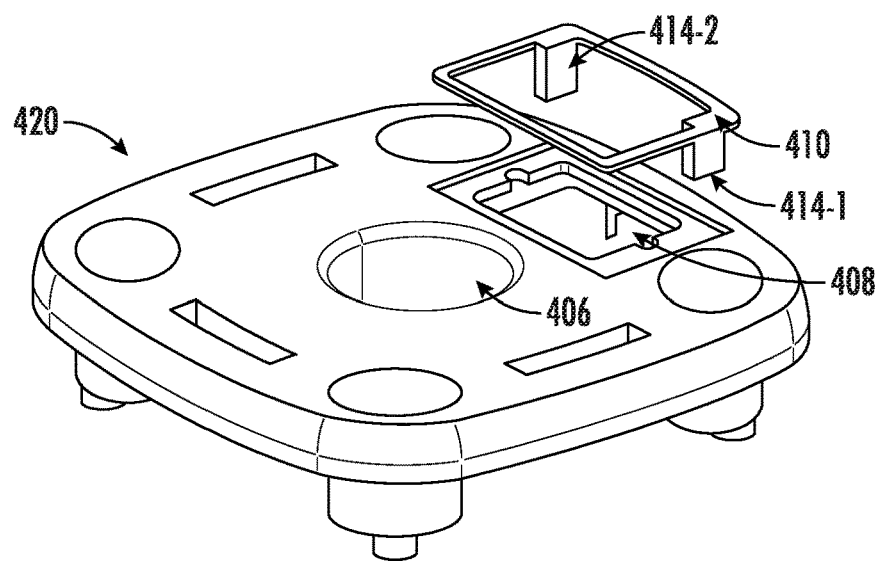
FIG. 4B shows a base of the removable blender jar of FIG. 4A partially exploded, in accordance with an embodiment of the present disclosure.

As further shown in FIGS. 4A-4B, the body 424 includes a first portion of conductive plating 409 (also referred to herein as conductive material) disposed adjacent the base 420. The first portion of conductive plating 409 at least partially surrounds the outer/external surface of the blender jar 418 and provides a ground plane, which may also be referred to herein as generally a second ground plane. Preferably, the first portion of conductive plating 409 fully encircles/surrounds the body 424 to increase surface area of the second ground plane. The blender jar 418 further includes a second portion of conductive plating 411 (or conductive material). The second portion of conductive material includes a profile that corresponds with the shape/profile of the handle 426. The second portion of conductive material provides a third ground plane. The first and second portions of conductive plating 411 may be electrically coupled such that the same collectively provide a single ground plane.

Figure 4C:
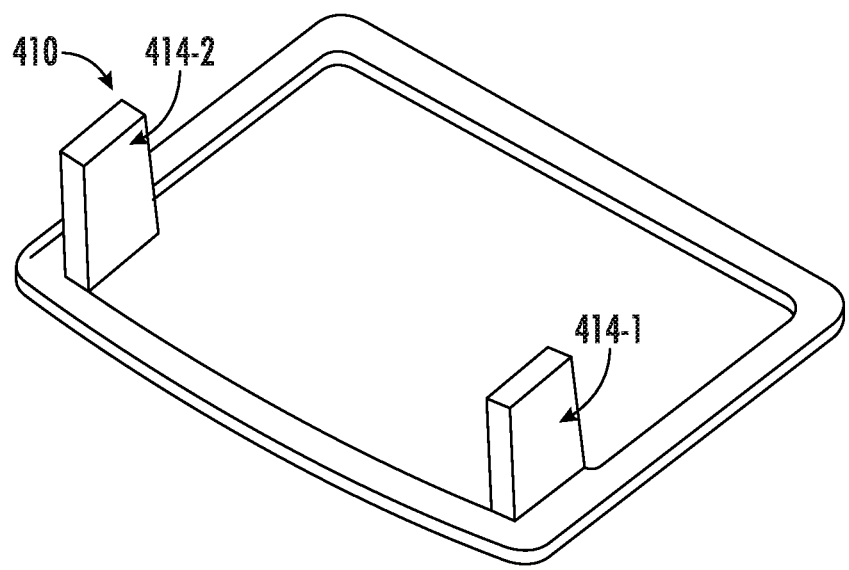
FIG. 4C shows a conductive plate suitable for use by the removable blender jar of FIG. 4A, in accordance with an embodiment.
Figure 4D:
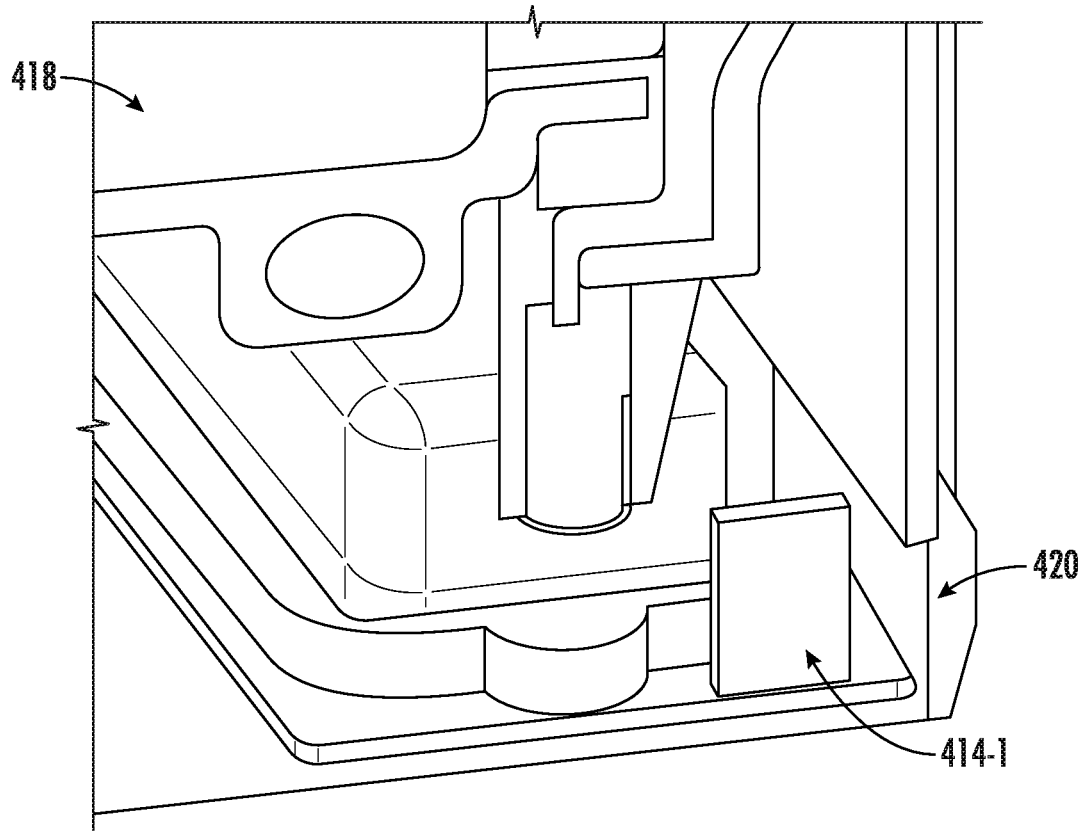
FIG. 4D shows a perspective view of a cavity formed between the base and the bottom of the blender jar of FIG. 4A, in accordance with an embodiment of the present disclosure.

As further shown in FIGS. 4A-4B, a fourth conductive plate 410 similar in shape to 210 is placed in the base 420 to preferably form a continuous ring around the electrical connector 499. FIG. 4C shows the conductive plate 410 in isolation in accordance with an embodiment. FIG. 4D shows how projection 414-1 extends into a cavity of the blender jar 418 to electrically couple with circuitry therein, in accordance with an embodiment.

Within the blender jar base 420, a single common electrical connection can preferably be made to connect all the portions of conductive material and conductive plate 410 together to form a common pseudo-ground connection that is also connected to a dedicated pin on the 6-pin electrical mating connectors, thereby making the pseudo-ground electrical connection from the blender jar 118 to the blender base 116 (See FIG. 1).

The conductive plates 210, 410 and conductive plating/coatings 409, 411 are intended to provide contact surfaces for any spilled food/liquid that is energized with voltage from electrical interconnect 302. The ground plane interface therefore serves to provide an electrical coupling to the ground fault detection circuit from any energized food/liquid.

Figure 5:
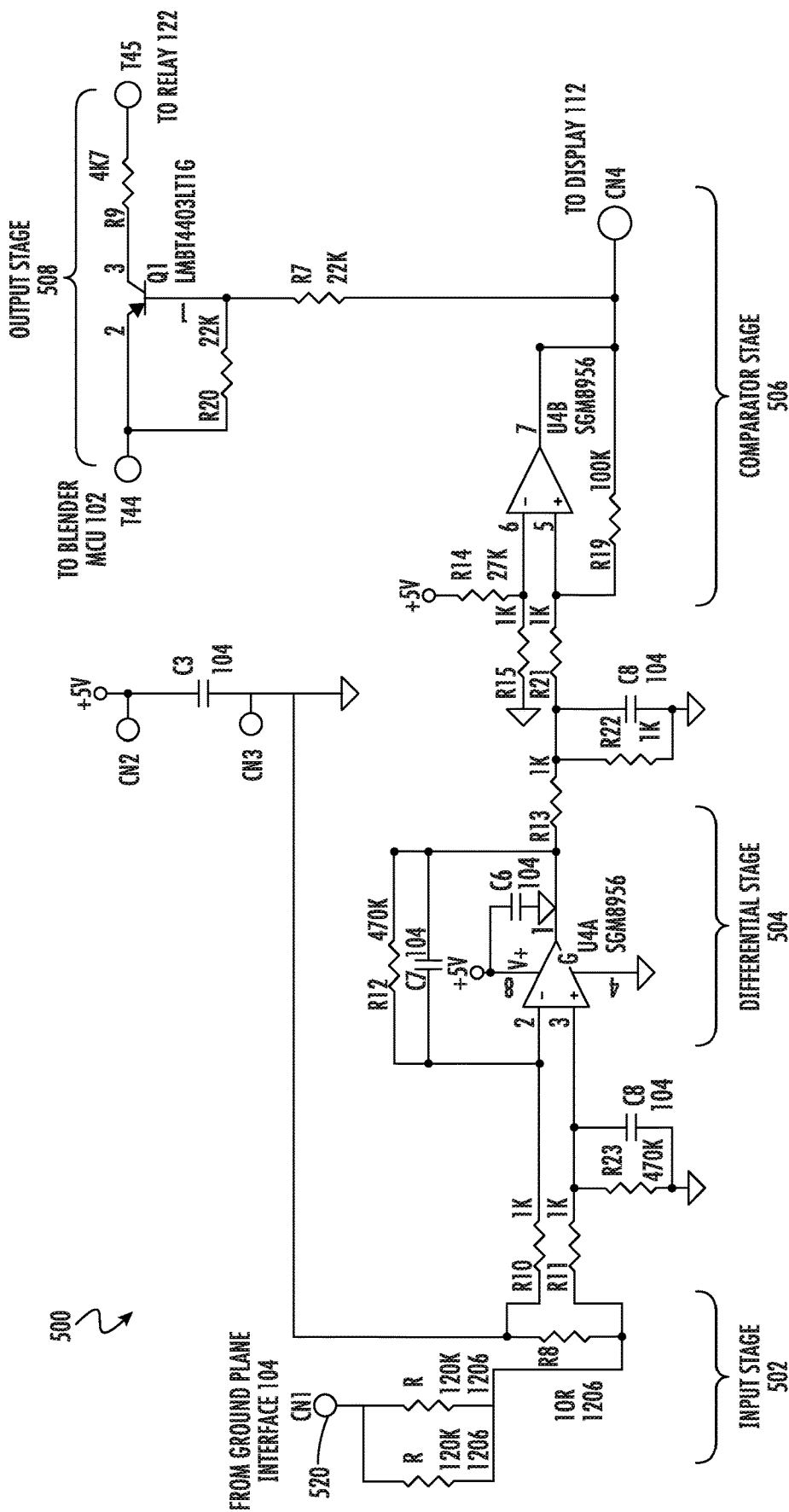
FIG. 5 shows an example ground fault (GF) detection circuit suitable for use in the system of FIG. 1.

FIG. 5 shows an example GF detection circuit 500 suitable for use as the GF detection circuit 106 shown in FIG. 1. As shown, the GF detection circuit includes a plurality of stages, namely an input stage 502, differential stage 504, comparator stage 506, and an output stage 508 to drive a switching arrangement, e.g., one or more relays. Each of the plurality of stages will now be discussed in turn.

The input stage 502 includes an input terminal 520. The input terminal 520 electrically couples to the ground plane interface 104 (See FIG. 1). The input stage 502 further includes two resistors (R1, R2) coupled in parallel with the input terminal 520. The two resistors (R1, R1) operate as a current divider and provide a high impedance input for the differential stage 504. The two resistors (R1, R2) also form a voltage divider with resistor R8, attenuating the voltage measured across R8 when a voltage is applied to input terminal 520.

In FIG. 5, the two resistors (R1, R2) are each rated at 120k Ohms, and in this instance collectively provide 60k Ohms of resistance when in parallel with each other. Continuing on, the two resistors (R1, R2) each include an end coupled to one side of sense resistor (R8). The other side of sense resistor (R8) electrically couples to a common internal ground of the power supply. Alternatively, R8 could be coupled to earth ground when a 3-pin power cord 120 is used. Each end/node of the sense resistor (R8) then electrically couples to first and second inputs of an op amp within the differential stage 504 by way of first and second gain resistors (R10, R11), respectively.

The first and second gain resistors (R10, R11) electrically couple to an inverting input and a non-inverting input of the first operation amplifier (U4A), respectively, which may also be referred to herein as simply first and second inputs. Resistors R12 and R23 are used together to set the desired gain of the differential voltage across R8. The first operational amplifier may be any suitable differential operational amplifier, and preferably, a fast response trigger operational amplifier. The output of the operational amplifier (U4A) then electrically couples to the comparator stage 506.

The comparator stage 506 includes a second operational amplifier (U4B) with an input coupled to the output of the first operational amplifier (U4A) of the differential stage 504. The second operational amplifier (U4B) may be any suitable operational amplifier, and preferably, a fast response trigger operational amplifier. The second operational amplifier (U4B) also includes a non-inverting input electrically coupled to the output of the first operational amplifier (U4B). The second operational amplifier (U4B) also includes an inverting input electrically coupled in parallel with a +5V reference supply (also referred to herein as a predetermined supply voltage) and a trigger/threshold resistor (R15). As discussed further below, the trigger resistor (R15), also referred to herein as a predetermined resistance value, is chosen based on a desired threshold value to ensure that measured current greater than a predefined threshold gets detected by the GF detection circuit 500 (and the relay 122 is opened, for example). The second operational amplifier (U4B) includes an output electrically coupled to output stage 508.

A transistor (Q1), also referred to herein as a transistor switch, of the output stage includes a base electrically coupled to the output of the second operational amplifier (U4B). The transistor (Q1) shown in FIG. 5 is a PNP transistor, although other types of transistors/switches are within the scope of this disclosure. The emitter of the transistor (Q1) couples to a terminal of the MCU 102, e.g., a GPIO pin. The collector of the transistor (Q1) couples to a terminal of the relay 122.

During non-faulted operation, the GF detection circuit, and in particular the comparator stage 506 outputs a LOW signal to the gate of transistor (Q1). The transistor (Q1) thus gets tied ON (active low). The blender MCU 102 may then switchably energize the heating element 108 ON/OFF. This allows the transistor (Q1) to operate as the logical AND gate shown in FIG. 1.

On the other hand, during fault operations such as when conductive blender material, e.g., food/liquid, electrically couples one or more of the plurality of ground planes discussed above with a live voltage pin/conductor of the electrical interconnect 302 (See FIG. 3B-3D), the GF detection circuit 106 can detect the fault and provide a signal to the display 112 and/or blender MCU 102 in addition to directly controlling Q1. First, current gets induced on or more of the aforementioned ground planes as a result of the fault condition. At the ground plane interface 104, a voltage then gets applied at the input stage 502 as a result of this leaked current. The differential stage 504, and in particular the first operational amplifier (U4A) and associated circuitry, then measures a change in voltage across sense resistor (R8). Based on ohms law, the voltage can be easily converted to a current value based on knowing the resistance value of R8 (I=V/R). The first operational amplifier (U4A) then amplifies the measured voltage drop across sense resistor (R8) and outputs the same to the comparator stage 506.

The comparator stage 506, and in particular the second operational amplifier (U4B), compares and amplifies the voltage difference between the output of the differential stage 504 to that of the voltage drop introduced by threshold resistor (R15). The output of comparator stage 506 then turns off Q1 by outputting a high signal and hence the relay 122 is turned off, removing power to the heater element and removing the electrical hazard from electrical interconnect 302. For instance, consider a scenario where a 5 mA current is the threshold current value/target to trigger a GF condition. In this scenario, the voltage across R8 which based on Ohms law, is proportional to 1 mA is 10 mV (e.g., 10 mV=10 ohms*1 mA).

Other target/threshold current values can be targeted by simply adjusting resistor R8. The output of the first operational amplifier (U4A) is determined by the gain set by the ratio of R12 to R10, in this example (470K/1K=470) and will therefore be 4.7V. The output of the second operational amplifier (U4B) then goes HIGH when the input voltage from the first operation amplifier (u4A) exceeds the threshold voltage set by R14 and R15, in this case 0.18V. The output stage 508, and in particular, the gate of the transistor (Q1), then goes HIGH which then switches the same to OFF. The AND logic discussed above thus preferably prevents the blender MCU 102 from switchably electrically coupling the heating element 108 to the power supply 103 by way of relay 122. Likewise, the HIGH signal output by the second operational amplifier (U4B) of the comparator stage 506 gets received by, for instance, the blender MCU 102 and/or display 112. In any such cases, the display 112 can indicate a fault condition has occurred, and optionally visualize a mitigating action such as a displaying a message that states "ELECTRICAL FAULT DETECTED. HEATING ELEMENT DISABLED. CLEANING REQUIRED. CONSULT MANUAL."

Notably, a blender consistent with the present disclosure can continue to power the blender MCU 102 and other circuitry such as the blade motor and motor controller to allow for at least partial use of the blender when in a fault mode. For instance, the heating element 108 gets disabled to reduce the risk of electric shock, as discussed above, but traditional blender operations which use the blades to chop/puree food and liquids/ice remain available to the user.

Figure 6:
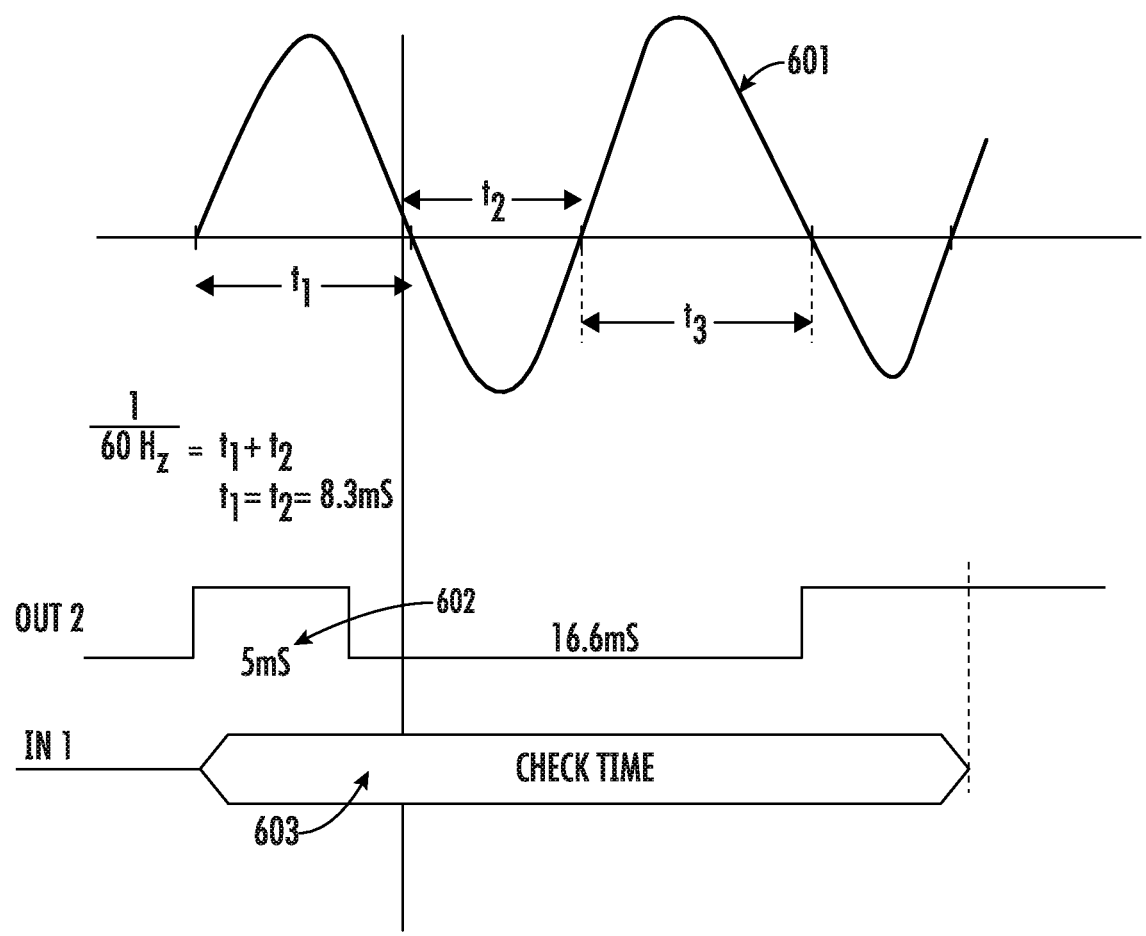
FIG. 6 shows a timing diagram of the ground fault detection circuit suitable for use in the system of FIG. 1.

FIG. 6 shows a timing diagram of the GF detection circuit 106 suitable for use in the system of FIG. 1. The waveform 601 is that of a typical US household 100 VAC at 60 Hz, hence the period is 16.6 ms and the waveform is positive voltage for half the period and is negative voltage for the other half of the period, e.g., 8.3 ms respectively. Based on the GF detection circuitry previously described, only positive voltages can be detected. Therefore, whereas the previously described circuitry is advantageous from a cost perspective as it is minimalistic, a drawback with it is that it can only detect ground faults during positive phase of the AC voltage. Upon applying voltage to the electrical interconnect 302 and with a hazardous ground fault in place, then detection could be delayed up to 8.3 ms due to the AC line voltage phase at that instance, as the GF detection circuit would wait to detect in the next positive phase.

In one embodiment, the output from the MCU that controls the relay (input to Q1 transistor) can be initialized so that the output is a short pulse, followed by an OFF pulse, followed by a continuous ON, waveform 602. The short pulse is timed to be 5 ms or less and the off pulse is timed to be 16.6 ms or a multiple thereof. In combination with this initialization sequence, the output of the GF detection circuit is also monitored by the MCU to ensure that the GF circuit is not triggered. If the MCU determines the presence of a GF during initialization, then the MCU terminates the initialization sequence and preferably causes the display of an error message. One purpose of the initialization sequence in this embodiment is to ensure that the negative AC voltage having a period of at least 5 ms, or less, can be detected so as to reduce the risk of hazard.

Figure 7:
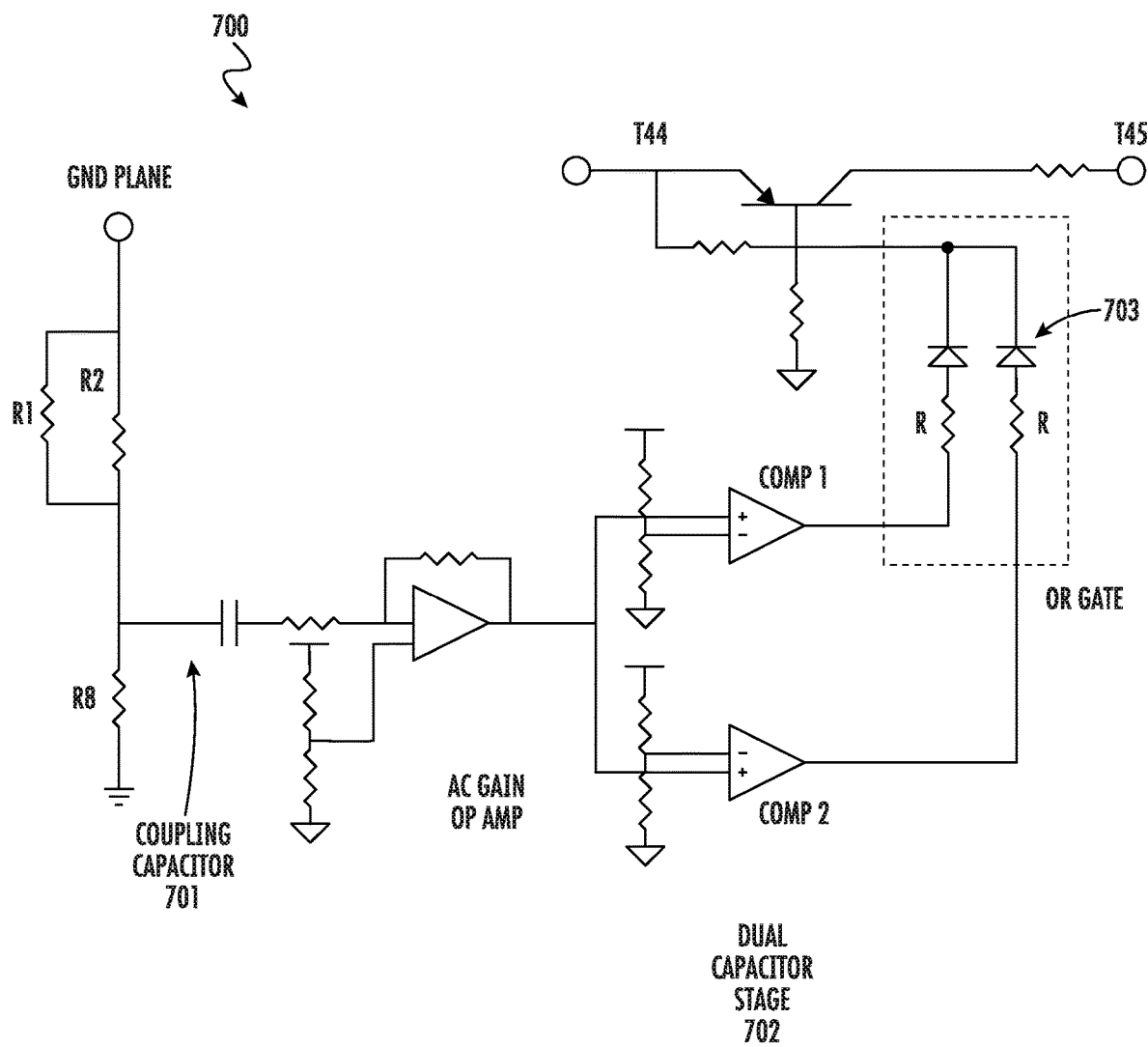
FIG. 7 shows another example ground fault (GF) detection circuit suitable for use in the system of FIG. 1.

FIG. 7 shows an another example ground fault (GF) detection circuit 700 suitable for use in the system of FIG. 1. This improved circuit utilizes a coupling capacitor and voltage biased AC gain operational amplifier to amplify the AC voltage that couples through the coupling capacitor 701. Similar to the previous circuit, R1 and R2 combine to provide a voltage divider with R8 to attenuate the AC waveform from the ground plane interface. The output from the first operational amplifier is then fed into a dual comparator stage 702 that allows for both positive voltage (comparator 1) and negative voltage (comparator 2) thresholds to be set and to be compared. This enables detection of a ground fault in either the positive or negative phase of the AC voltage. The outputs from each of the comparators are fed into an OR gate 703 that then controls the base voltage of Q1, as before. This enables either comparator to turn off the relay as soon as a ground fault is detected, regardless of the AC voltage phase. This circuit significantly improves detection relative to the circuit of FIG. 5, but requires more components to implement.

Figure 8:
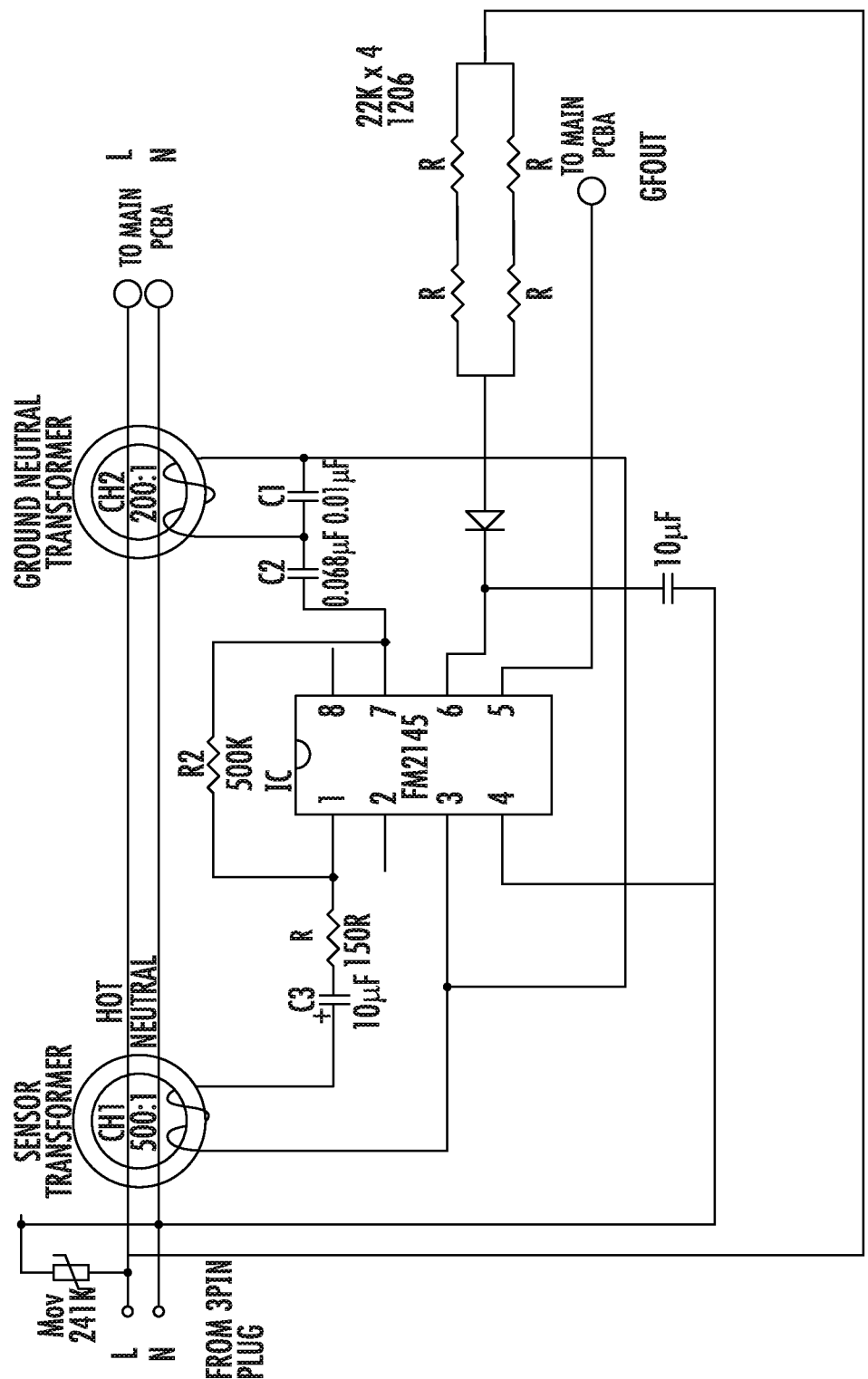
FIG. 8 shows a GF/current leak detection circuit configured with a GFCI arrangement that detects an imbalance of current in the live and neutral (return) lines by using sensing transformers and a ground fault interrupter IC.

FIG. 8 shows a GF/current leak detection circuit configured with a GFCI arrangement that detects an imbalance of current in the live and neutral (return) lines by using sensing transformers and a ground fault interrupter IC, FM2145 manufactured by Fudan Microelectronics. A current imbalance is caused when current flows from the live power line to earth ground via the conducting food/liquid and ground plane interface 104. The current is sensed by the sensing transformers that are configured so that the live and neutral lines pass through the center of the transformer/coil windings. A detection of current imbalance is outputted from the IC on PIN 5 and is an active HIGH for when imbalance is detected. Pin 5 can be connected to the aforementioned output stage 508 to control the relay 122 as well as being connected to the MCU 102 so that an error message can be displayed on display 112. The working principle of the circuit shown in FIG. 8 is well known and is documented in the datasheet for the FM2145 IC. This circuit is shown as an alternate GF detection circuit that can be used within a blender configured consistent with the present disclosure.

Figure 9:
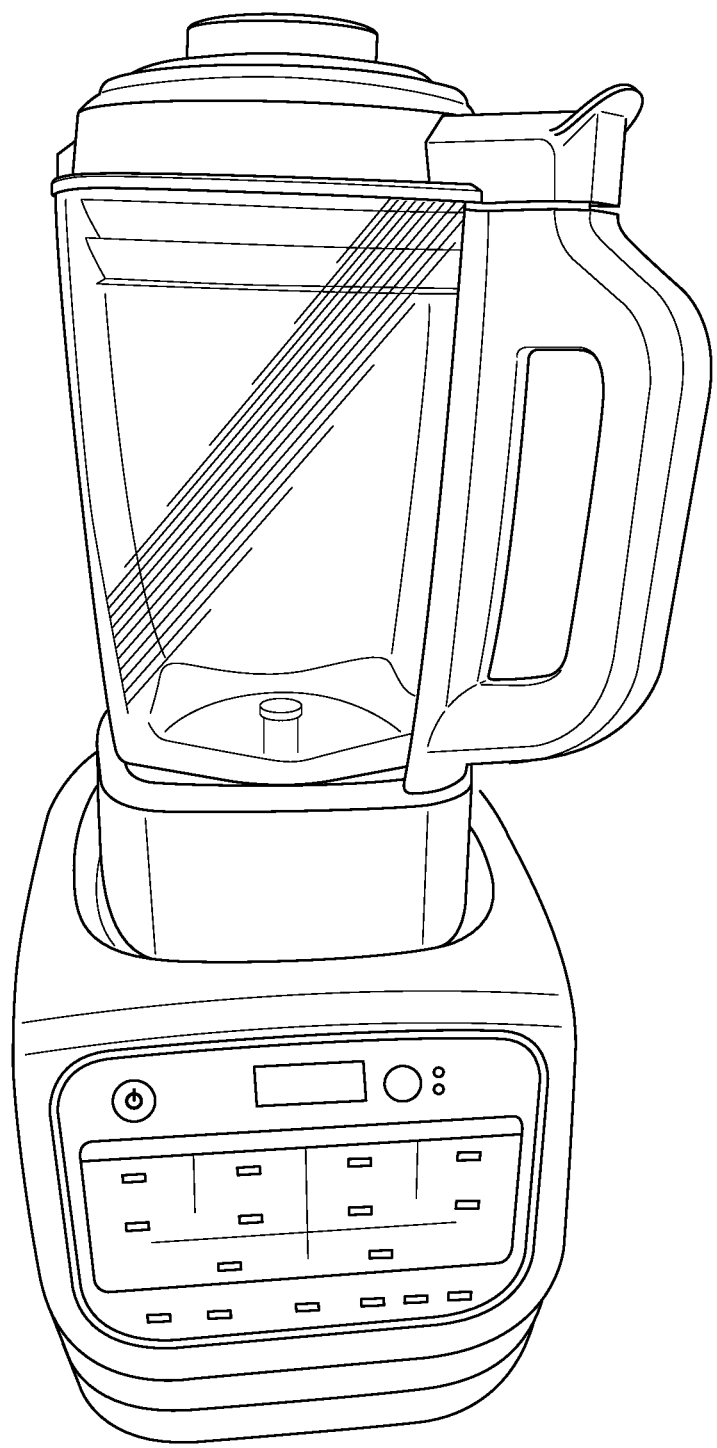
FIG. 9 shows an example blender consistent with embodiments of the present disclosure.

FIG. 9 shows an example blender with integrated food/beverage heating features that implements aspects and embodiments the GF detection circuitry and associated circuitry disclosed herein.

The present disclosure has identified that common foods/materials placed into blenders include different corresponding resistance values. Stated simply, some materials commonly blended have a low resistance value and therefore will conduct electricity relatively more easily than others. This disclosure has identified that known resistance values can be utilized to further increase accuracy of GF event detection.

Table 1 lists different food/liquids and a corresponding resistance value measured across a distance of 10 mm. As stated earlier, the banana smoothie mix has a very low resistance and increases the chance of an a electrical shock during operation of a blender.

TABLE 1

| Substance | @ 10 mm distance (in Ohms) | Composition |
|---|---|---|
| Water | 4.2k-4.6k | 40 g water from tap |
| Salt Water | 450-470 | 40 g water, 1 tbsp table salt comprising 97-99% sodium chloride (NaCl) |
| Soapy Water | 4k-6k | 40 g water, 10 drops soap |
| Banana Smoothie | 200-2k | 14 oz banana cut into square 1 inch pieces and frozen in −18 C. climate for 48 hours, 6 ice cubes comprising tap water frozen in 18 C. climate for at least 48 hours, and 12 oz of orange juice. |

Aspects and embodiments of the present disclosure achieve numerous advantages and aims directed to blenders as discussed in the preceding paragraphs. The following summary of the present disclosures provides some of those advantages and features which may be implemented in combination or individually within a blender. The present disclosure includes a blender with a removable blender jar that includes an integrated heating element that can utilize relatively high voltages, e.g., 120V, to rapidly heat food/beverage items. The blender may further include an integrated GF/current leak detection circuit to detect fault conditions and transition to a fault mode that disables supplying electricity to the removable blender jar. The blender may further include an integrated GF/current leak detection circuit configured to perform high-side current detection. The blender may further include an integrated GF/current leak detection circuit formed of a simple, in-expensive op-amp circuit to perform current sensing via voltage sensing without necessarily utilize galvanically-isolated sensing components. The blender may further include an integrated GF/current leak detection circuit that utilizes fast response switching op amps in a to achieve detection of current values exceeding a target threshold within 5 ms, and preferably within ~2-4 ms, to comport with regulatory standards governing GFCI operations. The blender may further include an integrated GF/current leak detection circuit to provide GF/leak detection without the use of a GFCI-enabled electrical outlet.

The blender may further include an integrated GF/current leak detection circuit to provide GF/leak detection at a response speed that detects GF/current leaks at a rate faster than GFCI-enabled electrical outlets, e.g., within 4 ms or less, and preferably within 1-3 ms. The blender may further include an integrated GF/current leak detection circuit to switchably decouple a heating element from a power source without interrupting power to a MCU and/or blade motor of the blender. The blender may further include an integrated GF/current leak detection circuit to detect a GF/current event based on one or more ground planes disposed around the blender coming into electrical contact with a power rail/terminal of the blender. The blender may further include at least one ground plane disposed on the handle of the blender jar, the base of the blender jar and/or the base of the blender, e.g., adjacent the user interface. The blender may further include a plurality of ground planes electrically interconnected via a ground plane interface/interconnect, the ground plane interface being coupled to a GF/current leak detection circuit.

The blender may further include an integrated GF/current leak detection circuit to provide GF/leak detection without the use of a GFCI-enabled electrical outlet. The blender may further include a blender with an integrated GF/current leak detection circuit disposed in a housing of the blender. The blende may further include an integrated GF/current leak detection circuit configured with a conventional GFCI arrangement, the conventional GFCI arrangement being disposed in the base of the blender. The blender may further include an integrated GF/current leak detection circuit configured with a conventional GFCI arrangement, the conventional GFCI arrangement being disposed in the base of the blender and configured to switchably decouple a heating element from a power supply without disrupting power the MCU and/or blade motor of the blender.

The blender may further include an integrated GF/current leak detection circuit that uses a mechanical relay to de-energize a heating element in response to detecting a GF or current leak. The blender may further include an integrated GF/current leak detection circuit to provide GF/leak detection even when the blender is used with a GFCI-enabled electrical outlet.

The blender may further include a user interface/display that indicates a GF or current leak has occurred. The blender may further include a user interface/display that indicates a GF or current leak has occurred and an action to mitigate the fault. The blender may further include a network interface circuit to send a message to an "App" on a computing remote device, e.g., a smart phone, that indicates a GF fault/current leak was detected and steps to mitigate the fault, e.g., cleaning instructions. The blender may further include an integrated GF/current leak detection circuit that can be adjusted to target a range of threshold/trigger current values (e.g., to comport with varying government-established GFCI requirements) based on the resistance value of a single resistor.

In accordance with an aspect of the present disclosure an appliance is disclosed. The appliance comprising a first portion with a receptacle to couple to a second portion, a first ground plane disposed on a surface defining the first portion, and a ground fault (GF) detection circuit, the GF detection circuit to detect a ground fault event based on a measuring a current induced on the first ground plane and output an electrical signal indicating a fault event.

In accordance with another aspect of the present disclosure an appliance is disclosed. The appliance comprising a first portion defining a receptacle to receive and removably couple to a second portion, the receptacle having an electrical interconnect to electrically couple the second portion to the first portion, a second portion, the second portion defining a cavity and a heating element, power supply within the first portion and a switching arrangement to switchably electrically couple the heating element to the power supply, at least a first ground plane disposed on the first portion and/or second portion, and a ground fault (GF) detection circuit, the GF detection circuit electrically coupled to the first ground plane, and wherein the GF detection circuit is configured to detect a ground fault event based on a measuring a current induced on the first ground plane, and in response to detecting the ground fault event, cause the switching arrangement to electrically decouple the heating element from the power supply.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. It will be appreciated by a person skilled in the art that an appliance may embody any one or more of the features contained herein and that the features may be used in any particular combination or sub-combination. Modifications and substitutions by one of ordinary skill in the art are considered to be within the scope of the present disclosure, which is not to be limited except by the claims.

What is claimed is:

1. An appliance, the appliance comprising:
 a blender base comprising a receptacle, the receptacle being configured to removably receive a blender jar;
 a first ground plane disposed on an external surface of the blender base, the first ground plane being disposed at least partially in the receptacle;
 a second ground plane defined by an external surface of the blender jar, the second ground plane being electrically coupled to the first ground plane to define a ground plane interface when the blender jar is disposed in the receptacle; and
 a ground fault (GF) detection circuit configured to detect a ground fault event in response to a current in the ground plane interface and output an electrical signal indicating the ground fault event, wherein the GF detection circuit is configured for high-side current sensing whereby at least the first ground plane couples between a supply rail and a load of the appliance.

2. The appliance of claim 1, further comprising a controller to receive the electrical signal from the GF detection circuit and transition to a fault mode based on the received electrical signal indicating the ground fault event.

3. The appliance of claim 1, wherein the blender base includes a conductor to electrically couple to a heating element disposed within the blender jar, and a relay to switchably electrically couple the conductor to a power supply.

4. The appliance of claim 3, wherein the relay is configured to switchably decouple the conductor from the power supply to disable heating functions of the blender jar based on the GF detection circuit indicating the ground fault event.

5. The appliance of claim 1, further comprising a user interface disposed on the blender base, and wherein the user interface is configured to provide a visual and/or audible indication of the ground fault event.

6. An appliance comprising:
 a blender base comprising a receptacle, the receptacle having an electrical interconnect;
 a blender jar, the blender jar being configured to be removably received in the receptacle with the electrical interconnect electrically coupling the blender jar to the blender base, the blender jar comprising a heating element;
 a power supply within the blender base;
 a switching arrangement to switchably electrically couple the heating element to the power supply;
 a first ground plane disposed on an external surface of the blender base and disposed at least partially in the receptacle;
 a second ground plane defined by an external surface of the blender jar, the second ground plane being electrically coupled to the first ground plane to define a ground plane interface when the blender jar is disposed in the receptacle; and
 a ground fault (GF) detection circuit, the GF detection circuit electrically coupled to the ground plane interface, wherein the GF detection circuit is configured to detect a ground fault event in response to a current in the ground plane interface, and in response to detecting the ground fault event, cause the switching arrangement to electrically decouple the heating element from the power supply, and wherein the GF detection circuit is configured for high-side current sensing whereby at least the first ground plane couples between a supply rail and a load of the appliance.

7. The appliance of claim 6, wherein the blender base further includes a user interface, and wherein the user interface is configured to visually indicate a fault condition based on a signal output by the GF detection circuit.

8. The appliance of claim 7, wherein the user interface is further configured to visually indicate a mitigating action to remedy the ground fault event.

9. The appliance of claim 6, further comprising a blade motor electrically coupled to the power supply and disposed in the blender base, and wherein the appliance is configured to energize the blade motor via the power supply during the ground fault event.

10. The appliance of claim 6, further comprising:
 a network interface circuit; and
 a controller to receive a signal from the GF detection circuit indicating the ground fault event, and in response to receiving the signal, sending a fault message to a remote computing device via the network interface circuit.

11. The appliance of claim 6, wherein the GF detection circuit comprises:
 an input stage having an input terminal to couple to at least the first ground plane, and wherein the input stage further includes a sensing resistor;
 a differential stage including a first operational amplifier having inputs coupled to first and second ends of the sensing resistor, respectively, the first operational amplifier to determine a voltage difference based on the sensing resistor and output a signal representing a measured voltage value based on the voltage difference; and
 a comparator stage having a second operational amplifier with a first input to couple to the output of the first operational amplifier and a second input coupled to a reference supply, the reference supply being associated with a threshold current value based on a predetermined supply voltage and a predetermined resistance value of at least one threshold resistor, and wherein the second operational amplifier outputs a signal based on a difference between the threshold current value and the output of the first operational amplifier.

12. The appliance of claim 11, wherein the switching arrangement further comprises a relay to selectively couple and decouple the heating element to the power supply, the GF detection circuit further comprising:
 an output stage, the output stage comprising a transistor switch, the transistor switch having a gate coupled to the output of the second operational amplifier, an emitter to couple to a microcontroller and a collector coupled to the relay, and wherein the transistor switch provides a logical AND gate to prevent the microcontroller from causing the relay to switchably couple the heating element to the power supply when the output of the second operational amplifier indicates a ground fault.

13. The appliance of claim 11, wherein the first and second operational amplifiers comprise fast response amplifiers.

14. The appliance of claim 6, wherein the GF detection circuit is configured to detect ground fault events based on a measured current from at least the first ground plane being greater than a predetermined threshold value.

15. The appliance of claim 14, wherein the GF detection circuit is configured to detect ground fault events and cause the heating element to switchably decouple from the power supply within a predetermined amount of time.

16. The appliance of claim 15, wherein the predetermined threshold value is 5 milliamps and the predetermined amount of time is 4 milliseconds or less.

\* \* \* \* \*